(12) United States Patent
Lee et al.

(10) Patent No.: US 7,935,961 B2
(45) Date of Patent: May 3, 2011

(54) MULTI-LAYERED BIPOLAR FIELD-EFFECT TRANSISTOR AND METHOD OF MANUFACTURING THE SAME

(75) Inventors: Sang Yoon Lee, Seoul (KR); Alan J. Heeger, Santa Barbara, CA (US); Kwang Hee Lee, Goleta, CA (US); Shinuk Cho, Goleta, CA (US)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 426 days.

(21) Appl. No.: 11/976,090

(22) Filed: Oct. 19, 2007

(65) Prior Publication Data

US 2009/0101891 A1    Apr. 23, 2009

(51) Int. Cl.
*H01L 51/05* (2006.01)
(52) U.S. Cl. ............ 257/40; 438/99; 257/E51.006
(58) Field of Classification Search .......... 257/40, 257/E51.004–E51.008; 438/99
See application file for complete search history.

(56) References Cited

U.S. PATENT DOCUMENTS

| | | | |
|---|---|---|---|
| 6,720,572 B1 * | 4/2004 | Jackson et al. | 257/40 |
| 7,372,070 B2 * | 5/2008 | Yatsunami et al. | 257/40 |
| 2003/0085397 A1 * | 5/2003 | Geens et al. | 257/40 |
| 2003/0218166 A1 * | 11/2003 | Tsutsui | 257/40 |
| 2006/0237731 A1 * | 10/2006 | Furukawa et al. | 257/83 |
| 2007/0007882 A1 * | 1/2007 | Fukuoka et al. | 313/503 |

OTHER PUBLICATIONS

Ikai et al (Applied Physics Letters, vol. 79, No. 2, Jul. 9, 2001).*

* cited by examiner

*Primary Examiner* — Matthew W Such
*Assistant Examiner* — Ali Naraghi
(74) *Attorney, Agent, or Firm* — Harness, Dickey & Pierce, PLC (57) ABSTRACT

Disclosed herein is a multi-layered bipolar field-effect transistor, including a gate electrode, a gate insulating layer, an electron transport layer, a hole transport layer, a source electrode, and a drain electrode, in which an intermediate separating layer is formed between the electron transport layer and the hole transport layer, and a method of manufacturing the same. The multi-layered bipolar field-effect transistor has advantages in that, since a P-channel and a N-channel are effectively separated, the electrical properties thereof, such as current ON/OFF ratio, electron mobility, hole mobility, and the like, are improved, and, since a device can be manufactured through a solution process without damaging layers, the processability thereof is improved.

25 Claims, 6 Drawing Sheets

MULTI-LAYERED BIPOLAR FIELD-EFFECT TRANSISTOR AND METHOD OF MANUFACTURING THE SAME

BACKGROUND

1. Field

Example embodiments relate to a multi-layered bipolar field-effect transistor and a method of manufacturing the same, and, more particularly, to a multi-layered bipolar field-effect transistor that includes a gate electrode, a gate insulating layer, a hole transport layer, an electron transport layer, a source electrode and a drain electrode, in which an intermediate separating layer is formed between the electron transport layer and hole transport layer, so that the function of each carrier transport channel can be sufficiently realized, and various devices can be manufactured through a solution process without damaging any of the layers, thereby improving processability, and to a method of manufacturing the same.

2. Description of the Related Art

Generally, an organic field-effect transistor exhibits excellent performance as a constituent of cheap, flexible and portable electronic devices, such as smart cards, electronic ID tags, active matrix displays, and the like. Recently, as the demand for small and light devices has increased, an organic bipolar field-effect transistor, which can be easily designed and manufactured by integrating a P-type channel and an N-type channel in one device, has attracted considerable attention.

A bipolar field-effect transistor is a device that is manufactured using bipolar technology. Since the bipolar field-effect transistor has the ability to prevent the destruction of devices by nonuniform current occurring in a pure bipolar device, and has high current capacity, very low ON-resistance, high switching speed and a negative temperature coefficient, the bipolar field-effect transistor is receiving a lot of attention in the high-voltage and high-speed application fields. However, since organic materials generally exhibit very high hole mobility and electron mobility, it is very difficult to manufacture an organic bipolar field-effect transistor.

In order to realize an organic bipolar field-effect transistor, research on materials, in which electrons and holes are simultaneously transported to two metals, constituting a source electrode and a gate electrode, and thus holes are injected into a hole injection electrode composed of a metal having a high work function, and electrons are injected into an electron injection electrode composed of a metal having a low work function, under an opposite gate voltage bias, is being conducted. Further, as methods of realizing an organic bipolar field-effect transistor, attempts to use a mixture of an electron transport material and a hole transport material as an active layer material in a channel have been made, and bipolar field-effect transistors having a two-layered structure including a hole transport layer and an electron transport layer have been disclosed.

The method of realizing an organic bipolar field-effect transistor using a mixture of an electron transport material and a hole transport material is advantageous in that a channel can be formed in one step by treating a semiconductor mixture solution. However, in this method, it is difficult to obtain a continuous network of two components, that is, an electron transport material and a hole transport material, in a limited space adjacent to the interface between the space and a gate electrode because two-dimensional percolation must be conducted under the condition such that the volume fraction of the solution is above 50%. Moreover, in this method, the mobility of electrons or holes in complicated channels located in a phase-separated two-component mixture is remarkably decreased, compared to the state in which each of the components is pure. Further, in this method, there is a problem in that, when holes and electrons coexist in the same channel, non-FET behavior can occur when low gate voltage is applied thereto. It is inferred that this non-FET behavior occurs because electrons and holes are recombined in the interface between a P-type material and an N-type material by Coulomb force. Accordingly, the bipolar FET, manufactured using the mixture of the electron transport material and the hole transport material, typically realizes a low current ON/OFF ratio.

Meanwhile, a hetero-structured field-effect transistor having an independently-separated hole transport channel and electron transport channel was also disclosed. However, in the hetero-structured FET, there is a problem in that the realization of the real behavior of the P-channel and N-channel at low gate voltages is prevented by the interaction between carriers located in the interface between the two layers. Furthermore, there is a problem in that, when the two layers are fabricated through a solution process, a first layer, which is previously formed beneath a second layer, can be damaged by layering the second layer on the first layer. These problems can be minimized using two insoluble materials, but, in most of the attempts to manufacture a two-layered bipolar FET, cannot be overcome because the two-layered bipolar FET is manufactured by thermally depositing small molecules under high vacuum conditions.

SUMMARY

Accordingly, example embodiments have been made keeping in mind the above problems occurring in the prior art, and example embodiments provide a multi-layered bipolar field-effect transistor having excellent electrical properties, such as current ON/OFF ratio, etc., and having high processability.

Example embodiments provide an electronic device including the multi-layered bipolar field-effect transistor.

Example embodiments provide a method of manufacturing the multi-layered bipolar field-effect transistor, which can be used to manufacture a multi-layered bipolar field-effect transistor having excellent properties through a solution process.

In order to accomplish the above objects, an aspect of example embodiments provides a multi-layered bipolar field-effect transistor, including a gate electrode, a gate insulating layer, an electron transport layer, a hole transport layer, a source electrode, and a drain electrode, in which the source electrode and the drain electrode are formed such that they face at least one of the electron transport layer and the hole transport layer, and an intermediate separating layer is formed between the electron transport layer and the hole transport layer.

Another aspect of example embodiments provides an electronic device including the multi-layered bipolar field-effect transistor.

A further aspect of example embodiments provides a method of manufacturing a multi-layered bipolar field-effect transistor, the transistor including a gate electrode, a gate insulating layer, an electron transport layer, a hole transport layer, a source electrode and a drain electrode, including the steps of forming the source electrode and the drain electrode such that they face at least one of the electron transport layer and the hole transport layer, and forming an intermediate separating layer between the electron transport layer and the hole transport layer.

BRIEF DESCRIPTION OF THE DRAWINGS

The above and other objects, features and advantages of example embodiments will be more clearly understood from the following detailed description taken in conjunction with the accompanying drawings, in which.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DESCRIPTION OF THE PREFERRED EMBODIMENTS

Hereinafter, preferred embodiments of example embodiments will be described in detail with reference to the attached drawings.

Reference now should be made to the drawings, in which the same reference numerals are used throughout the different drawings to designate the same or similar components.

Example embodiments provide a multi-layered bipolar field-effect transistor, including a gate electrode, a gate insulating layer, an electron transport layer, a hole transport layer, a source electrode, and a drain electrode, in which the source electrode and the drain electrode are formed such that they face at least one of the electron transport layer and the hole transport layer, and an intermediate separating layer is formed between the electron transport layer and the hole transport layer such that they do not directly come into contact with each other.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

That is, the multi-layered bipolar field-effect transistor of example embodiments is formed to have several layers using a P-type organic semiconductor, for example, poly(3-hexylthiophene)("rr-P3HT"), and an N-type organic semiconductor ("PCBM"), for example, [6,6]-phenyl-$C_{61}$-butyric acid methyl ester, through spin casting. The multi-layered bipolar field-effect transistor of example embodiments includes two layers fabricated using an electron transport layer composed of the P-type organic semiconductor and a hole transport layer composed of the N-type organic semiconductor. In addition, in order to obtain a desirable two-layered structure, an intermediate separating layer composed of sol-gel treated titanium suboxides ($TiO_x$) is formed between the two semiconductor layers.

Figure 1A:
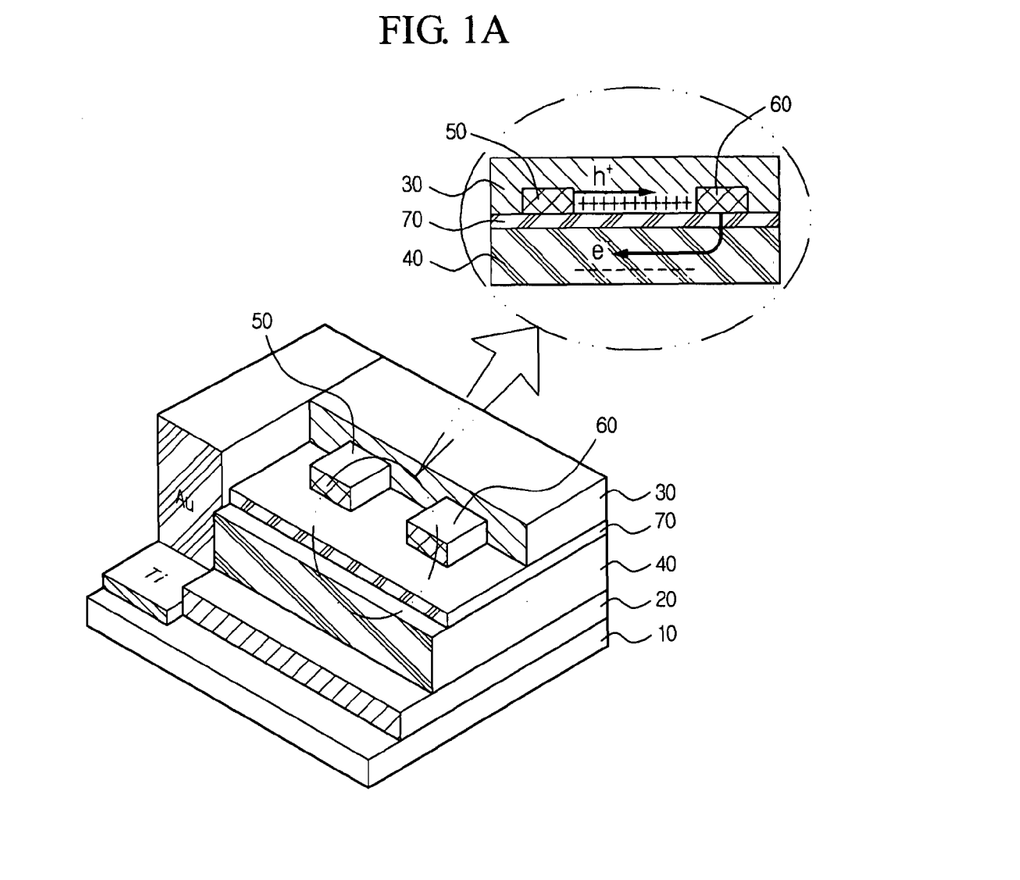
FIG. 1A is a schematic perspective view showing a multi-layered bipolar field-effect transistor according to an embodiment of example embodiments.

FIG. 1A shows the structure of a multi-layered bipolar field-effect transistor according to an embodiment of example embodiments. Referring to FIG. 1A, the multi-layered bipolar field-effect transistor according to an embodiment of example embodiments includes a substrate 10 serving as a gate electrode, a gate insulating layer 20 formed on the substrate 10, an electron transport layer 40, composed of an N-type organic semiconductor, formed on the gate insulating layer 20, an intermediate separating layer 70 formed on the electron transport layer 40, a source electrode 50 and a drain electrode 60 formed on the intermediate separating layer 70, and a hole transport layer 30, composed of a P-type organic semiconductor, formed on the intermediate separating layer 70 on which the source electrode 50 and the drain electrode 60 may be formed.

In the multi-layered bipolar field-effect transistor, in the case where a substrate may serve as a gate electrode, a gate insulating layer may be directly formed on the substrate, rather than separately forming the substrate and gate electrode. For example, when a gate insulating layer is formed on a silicon substrate using $SiO_2$, the silicon substrate can serve both as a substrate and a gate electrode. In example embodiments, FIGS. 1 to 7 show embodiments in which the substrate and the gate electrode may be integrally formed such that they form one layer.

As shown in FIG. 1A, in the multi-layered bipolar field-effect transistor, an intermediate separating layer 70 is formed between a P-type hole transport layer 30 and an N-type electron transport layer 40, and thus a P-channel path and an N-channel path can be accurately separated in one device structure. However, in order to accurately separate the P-channel path and the N-channel path, the materials constituting the intermediate separating layer 70 must transport one carrier selected from the group consisting of a hole and an electron, and must block the other carrier. Further, the materials constituting the intermediate separating layer 70 must not chemically react with the two semiconductor materials. Finally, in order to apply printing technology thereto, the two carrier transport layers and the intermediate separating layer 70 must be able to be formed through a solution process without damaging the previously formed layer.

Figure 1B:
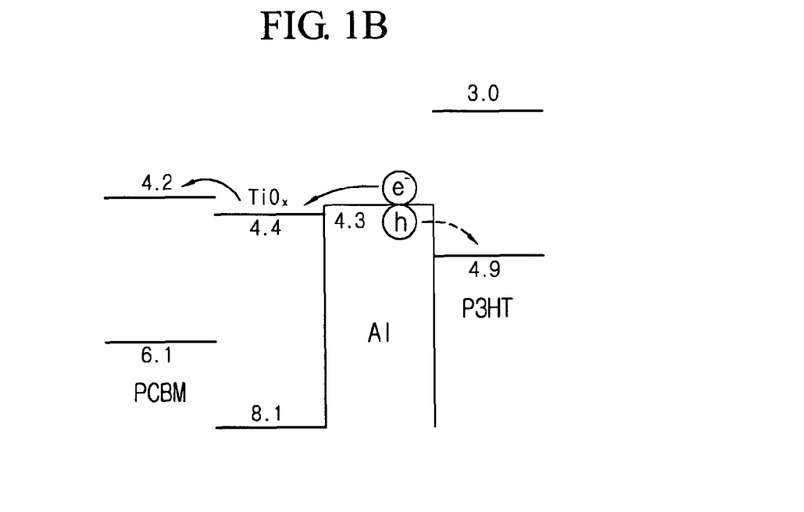
FIG. 1B is a schematic view showing the energy level of each layer of the multi-layered bipolar field-effect transistor of FIG. 1A.

In example embodiments, the intermediate separating layer 70 may include insulating oxides, preferably sol-gel treated titanium suboxides ($TiO_x$). Titanium suboxides ($TiO_x$) may be excellent electron transporting materials as well as hole blocking materials. The electron transport layer is composed of stereoregular poly(3-hexylthiophene)("rr-P3HT"), and the hole transport layer is composed of [6,6]-phenyl-$C_{61}$-butyric acid methyl ester ("PCBM"). Further, the intermediate separating layer, composed of $TiO_x$, is formed between the electron transport layer and the hole transport layer. In the structure formed above, FIG. 1B shows the minimum energy level of $TiO_x$ in the conduction band and the maximum energy level of $TiO_x$ in the valence band, measured using light absorption data and cyclic voltammetry data. The energy level (4.4 eV) of $TiO_x$ in the conduction band is approximate to the work function (4.3 eV) of aluminum, and is approximate to the energy level (4.2 eV) of PCBM in the lowest unoccupied molecular orbital (LUMO). The maximum energy level (8.1 eV) of $TiO_x$ in the valence band is electronegative enough to block holes. Therefore, $TiO_x$ may function as an intermediate separating layer between a hole transport channel and an electron transport channel.

Moreover, since $TiO_x$ precursors can be prepared using an isopropyl alcohol solution or a methanol solution, a $TiO_x$ thin film can be formed through spin casting using an organic solvent without damaging the previously formed lower layer. A solid $TiO_x$ thin film is not easily dissolved in an organic solvent, such as chloroform, dichlorobenzene or toluene, which is used for dissolving semiconductive polymers or substituted fullerene. Therefore, the previously formed lower layer is not damaged in subsequent processes.

In order to explain the operation of the multi-layered bipolar field-effect transistor of example embodiments, an electron transport layer 40, an intermediate separating layer 70 and a hole transport layer 30 are shown enlarged in the circle drawn with a dotted line in FIG. 1A. The intermediate separating layer 70 prevents a first layer, for example, the electron transport layer 40, which is previously layered, from dissolving when a second layer, for example, the hole transport layer 30, is deposited. Referring to the enlarged portion of FIG. 1A, the transistor of example embodiments may be operated in P-channel mode by holes in the hole transport layer 30, and may be operated in N-channel mode by electrons in the electron transport layer 40. The intermediate separating layer 70 formed between the hole transport layer 30 and the electron transport layer 40 acts as a separation layer allowing holes or electrons to be injected into only the desired layer (that is, holes are injected into the hole transport layer, and electrons are injected into the electron transport layer), thus accurately separating the P-channel and N-channel.

In example embodiments, the thickness of the intermediate separating layer 70 may be in the range of 1 to 1000 nm, but is not particularly limited thereto. When the thickness of the intermediate separating layer is below 1 nm, the electron transport layer and hole transport layer are not easily separated. In contrast, when the thickness thereof is above 1000 nm, carrier injection may be hindered.

In example embodiments, a P-type organic semiconductor material, which can be used as a material for the hole transport layer 30, may include, but is not limited to, low-molecular materials, such as porphyrin compound derivatives including N,N'-diphenyl-N,N -di(3-methylphenyl)-4,4'-diaminobiphenyl, N,N'-diphenyl-N,N'-dinaphthyl-4,4'-diaminobiphenyl, and N,N,N',N'-tetraphenyl-21H,23H-porphyrin; triarylamine derivatives including polymers having an aromatic tertiary amine in a main chain or side chains thereof, 1,1-bis (4-di-p-tolylaminophenyl)cyclohexane, N,N,N-tri(p-tolyl) amine, and 4,4',4'-tris[N-(3-methylphenyl)-N-phenylamino] triphenylamine; carbazole derivatives, including N-phenylcarbazole and polyvinylcarbazole; phthalocyanine derivatives, including metal-free phthalocyanine and copper phthalocyanine; starburst amine derivatives; enaminestilbene derivatives; styryl amine derivatives, including aromatic tertiary amine; spirobifluorenyl anthracene; tetrafluorene; pentacene, thiophene, aniline; pyrrole; phenylene vinylene; and the like, and macromolecular materials, such as polythiophene, polythiophene-thiazole, polyaniline, polyacetylene, polypyrrole, polyphenylene vinylene, and derivatives thereof. Specifically, the P-type organic semiconductor material may include a material selected from the group consisting of poly-3-hexyl-thiophene (P3HT), poly[2-methoxy-5-(2'-ethyl-hexyloxy)-1,4-phenylene vinylene (MEH-PVV), poly (2,5-thienylene vinylene) (PVT), and poly(3',4'-dialkyl-2,2', 5',2-terthiophene.

In example embodiments, the N-type semiconductor material constituting the electron transport layer 40 may include, but is not limited to, low-molecular materials, such as fullerene (C60) and derivatives thereof (e.g. PCBM ([6,6]-phenyl C61-butyric acid methyl ester)), thiophene derivatives substituted with perfluoroalkyl groups, phthalocyanine derivatives substituted with perfluoroalkyl groups, derivatives including thiazole, thiadiazole, oxazole, isooxazole, oxadiazole, imidazole, pyrazole, triazole and tetrazole, and derivatives including pyridine, pyridazine, pyrimidine, pyrazine, and triazine, quinoline, isoquinoline, quinoxaline, naphthyridine, benzoimidazole, pyridopyrimidine, benzothiazole, benzothiadiazole, benzotriazole, benzooxazole, phenanthridine, phenanthroline and phenazine; and macromolecular materials, such as Poly(p-phenylene-2,6-benzobisthiazole) (PBZT), Poly(benzobisimidazobenzophenanthroline) (BBL), and N,N'-bis[3-[2-[2-(1-butoxy)ethoxy]ethoxy]propyl]perylene-3,4,9,10-tetracarboxyimide(PPEEB).

In the multi-layered bipolar field-effect transistor according to an embodiment of example embodiments, the electron transport layer 40 may include [6,6]-phenyl-$C_{61}$-butyric acid methyl ester ("PCBM"), the hole transport layer 30 may include stereoregular poly(3-hexylthiophene)("rr-P3HT"), and the intermediate separating layer 70 may include $TiO_x$. Considering that $TiO_x$ has electron transporting and hole blocking properties, in all possible devices, it is most preferable that a PCBM layer, a $TiO_x$ layer and a P3HT layer be sequentially layered.

In example embodiments, as a substrate, a silica substrate, a glass substrate, a plastic substrate, or the like may be selectively used by those skilled in the art depending on the use thereof, without departing from the purpose thereof. The plastic substrate may include, but is not limited to, polyethylene naphthalate, polyethylene terephthalate, polycarbonate, polyvinyl butyral, polyacrylate, polyimide, polynorbonene, polyether sulfone, and the like.

When a substrate or a gate insulating layer does not serve as a gate electrode (for example, a glass substrate or a polymer substrate), a conductive layer must be formed on the substrate by applying a conductive material thereon. The conductive material applied on the substrate may include, but is not limited to, indium-tin oxide (ITO), fluorine-doped tin oxide (FTO), $ZnO-Ga_2O_3$, $ZnO-Al_2O_3$, $SnO_2-Sb_2O_3$, and the like. In addition to this conductive material, a conductive polymer may be applied on the substrate. The conductive polymer may include polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsilyl)diphenylacetylene, poly(carbazole) diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, mixtures thereof, and polythiophene.

In the transistor of example embodiments, in order to accomplish the effective injection of carriers, such as holes, and electrons, it is necessary to deposit a source electrode and a drain electrode having middle contact geometry. The metals constituting the electrodes must allow holes to be injected into the highest occupied molecular orbital (HOMO) of an electron transport layer, and must allow electrons to be injected into the lowest unoccupied molecular orbital (LUMO) of an electron transport layer. Therefore, it is preferred that electrode materials that enable the uniform injection of holes and electrons be used. These electrodes may includes one or more materials selected from the group consisting of gold, silver, aluminum, nickel, molybdenum, tungsten, chromium, and alloys thereof; metal oxides, including indium-tin oxide (ITO) and indium-zinc oxide; and conductive polymers, including polythiophene, polyaniline, polyacetylene, polypyrrole, polyphenylene vinylene, and a PEDOT (polyethylenedioxythiophene)/PSS(polystyrenesulfonate) mixture. The gate electrode may have a thickness of about 500 to 2,000 Å, and the source/drain electrodes may have a thickness of about 500 to 2,000 Å, respectively. These electrodes may be used by patterning them using general methods depending on the use and necessity thereof.

The gate insulating layer 20 may be composed of insulating materials having a high dielectric constant. Specifically, the insulating materials may include ferroelectric insulating materials selected from the group consisting of $Ba_{0.33}Sr_{0.66}TiO_3$(BST), $Al_2O_3$, $Ta_2O_5$, $La_2O_5$, $Y_2O_3$ and $TiO_2$; inorganic insulating materials selected from the group consisting of $PbZr_{0.33}Ti_{0.66}O_3$(PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$ and AlON; and organic insulating materials including polyimide, benzenecyclobutene (BCB), parylene, polyacrylate, polyvinyl alcohol, polyvinyl phenol, and the like. This gate insulating layer may have a thickness of 1,000 to 10,000 Å, but is not limited thereto. This gate insulating layer 20 may be used by patterning it using general methods depending on the use and necessity thereof.

Generally, the multi-layered bipolar field-effect transistor of example embodiments may include a gate electrode, a gate insulating layer, an electron transport layer, a hole transport layer, and source/drain electrodes, but the layer structure thereof is not limited thereto. For example, the multi-layered bipolar field-effect transistor of example embodiments may have a bottom-contact type structure or a top-contact type structure, and each of the structures may have a bottom gate structure or a top gate structure, but is not limited thereto. The structure of the multi-layered bipolar field-effect transistor of example embodiments may be modified within a range that does not depart from the scope of the invention.

As described above, in the multi-layered bipolar field-effect transistor of example embodiments, the source electrode and drain electrode may be formed such that they face at least one of the electron transport layer and the hole transport layer, and an intermediate separating layer is formed between the electron transport layer and the hole transport layer. Hereinafter, various structures of the multi-layered bipolar field-effect transistor of example embodiments will be described.

Figure 2:
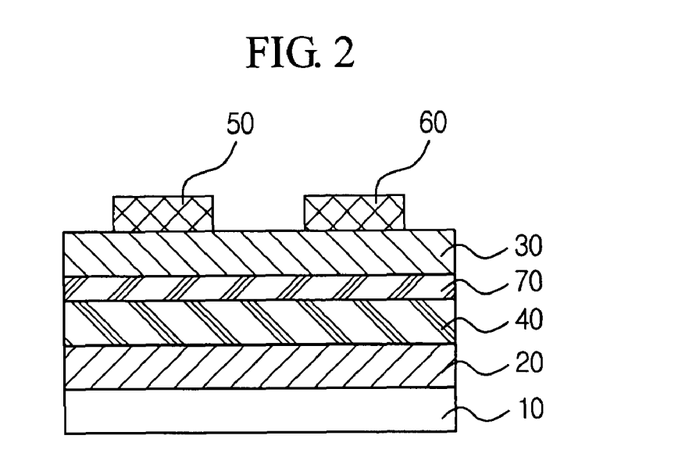
FIGS. 2 to 7 are schematic sectional views showing multi-layered bipolar field-effect transistors according to other embodiments of example embodiments, respectively.

According to the multi-layered bipolar field-effect transistor of an aspect of example embodiments, an electron transport layer 40 and a hole transport layer may be sequentially layered on an insulating layer, and an intermediate separating layer is formed between the electron transport layer and the hole transport layer. Specifically, the multi-layered bipolar field-effect transistor according to a first embodiment of example embodiments, as shown in FIG. 2, may include a substrate 10 serving as a gate electrode; a gate insulating layer 20 formed on the substrate 10; an electron transport layer 40 formed on the gate insulating layer 20; an intermediate separating layer 70 formed on the electron transport layer 40; a hole transport layer 30 formed on the intermediate separating layer 70; and a source electrode 50 and a drain electrode 60 formed on the hole transport layer 30.

Figure 3:
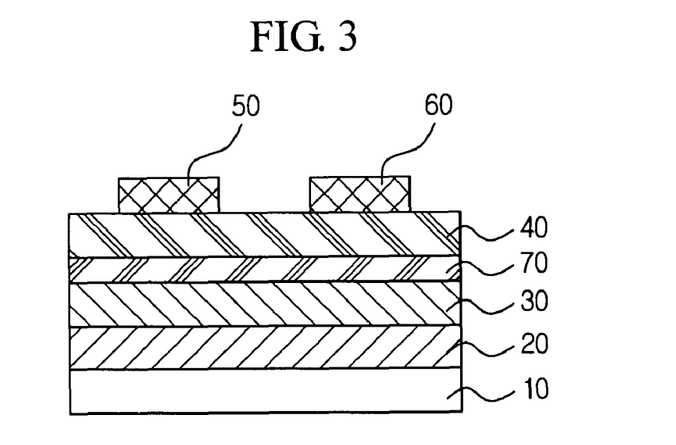

The multi-layered bipolar field-effect transistor according to a second embodiment of example embodiments, as shown in FIG. 3, may include a substrate 10 serving as a gate electrode; a gate insulating layer 20 formed on the substrate 10; a hole transport layer 30 formed on the gate insulating layer 20; an intermediate separating layer 70 formed on the hole transport layer 30; an electron transport layer 40 formed on the intermediate separating layer 70; and a source electrode 50 and a drain electrode 60 formed on the electron transport layer 40.

Figure 4:
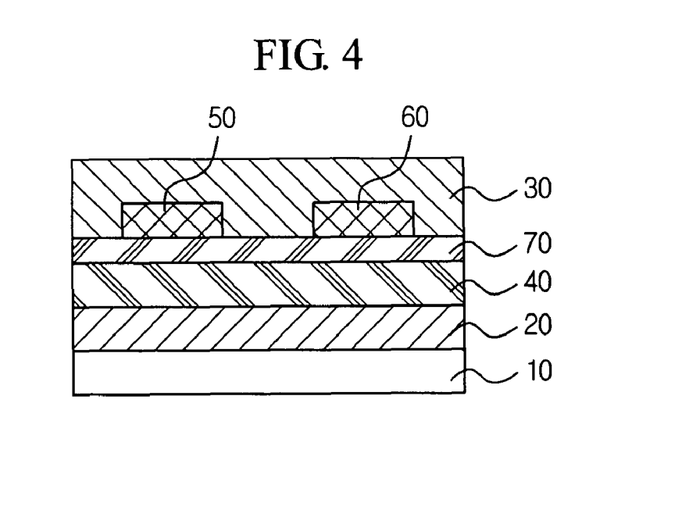

According to the multi-layered bipolar field-effect transistor of a third embodiment of example embodiments, one carrier transport layer is formed on an insulating layer, source and drain electrodes may be formed on the insulating layer, and the other carrier transport layer is formed on the source and drain electrodes. In an example, the multi-layered bipolar field-effect transistor of the third embodiment of example embodiments, as shown in FIG. 4, may include a substrate 10 serving as a gate electrode; a gate insulating layer 20 formed on the substrate 10; an electron transport layer 40 formed on the gate insulating layer 20; an intermediate separating layer 70 formed on the electron transport layer 40; a source electrode 50 and a drain electrode 60 formed on the intermediate separating layer 70; and a hole transport layer 30 formed on the intermediate separating layer 70 on which the source electrode 50 and drain electrode 60 may be formed.

Figure 5:
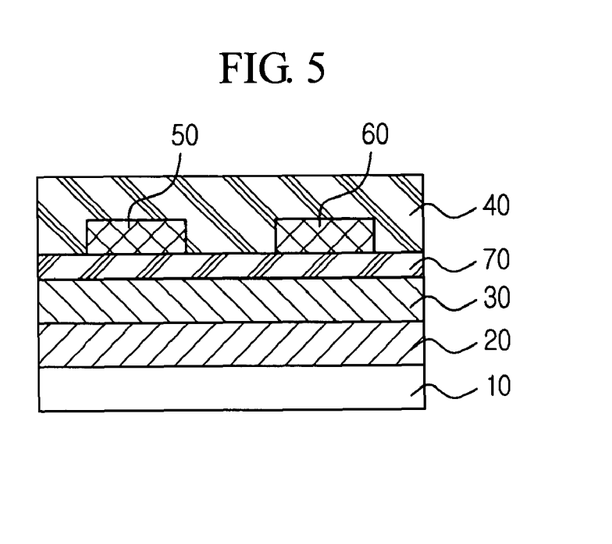

The multi-layered bipolar field-effect transistor of a fourth embodiment of example embodiments, as shown in FIG. 5, may include a substrate 10 serving as a gate electrode; a gate insulating layer 20 formed on the substrate 10; a hole transport layer 30 formed on the gate insulating layer 20; an intermediate separating layer 70 formed on the hole transport layer 30; a source electrode 50 and a drain electrode 60 formed on the intermediate separating layer 70; and an electron transport layer 40 formed on the intermediate separating layer 70 on which the source electrode 50 and the drain electrode 60 may be formed.

Figure 6:
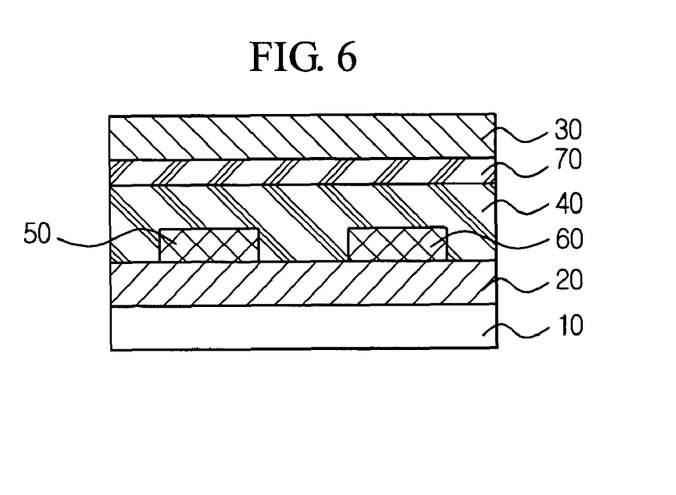

According to the multi-layered bipolar field-effect transistor of a fifth embodiment of example embodiments, two carrier transport layers may be layered on source and drain electrodes, and an intermediate separating layer is interposed between the two carrier transport layers. In an example, the multi-layered bipolar field-effect transistor of the fifth embodiment of example embodiments, as shown in FIG. 6, may include a substrate 10 serving as a gate electrode; a gate insulating layer 20 formed on the substrate 10; a source electrode 50 and a drain electrode 60 formed on the gate insulating layer 20; an electron transport layer 40 formed on the gate insulating layer 20 on which the source electrode 50 and drain electrode 60 may be formed; an intermediate separating layer 70 formed on the electron transport layer 40; and a hole transport layer 30 formed on the intermediate separating layer 70.

Figure 7:
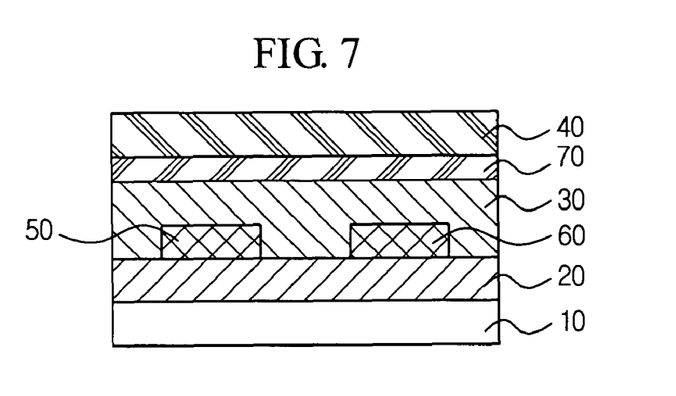

The multi-layered bipolar field-effect transistor of a sixth embodiment of example embodiments, as shown in FIG. 7, may include a substrate 10 serving as a gate electrode; a gate insulating layer 20 formed on the substrate 10; a source electrode 50 and a drain electrode 60 formed on the gate insulating layer 20; a hole transport layer 30 formed on the gate insulating layer 20 on which the source electrode 50 and drain electrode 60 may be formed; an intermediate separating layer 70 formed on the hole transport layer 30; and an electron transport layer 40 formed on the intermediate separating layer 70.

The multi-layered bipolar field-effect transistor of example embodiments may be employed as a switching device or a driving device for electronic devices, such as organic light-emitting devices, organic photoelectric devices, active matrix displays, and the like. Accordingly, the multi-layered bipolar field-effect transistor of example embodiments can be applied to inverters and complimentary circuits, which are the basis of logic devices and ring oscillators.

Another aspect of example embodiments provides a method of manufacturing the multi-layered bipolar field-effect transistor. The method of manufacturing the multi-layered bipolar field-effect transistor, the transistor including a gate electrode, a gate insulating layer, an electron transport layer, a hole transport layer, a source electrode and a drain electrode, includes the steps of forming the source electrode and the drain electrode such that they face at least one of the electron transport layer and the hole transport layer and forming an intermediate separating layer between the electron transport layer and the hole transport layer.

Specifically, in the method of manufacturing the multi-layered bipolar field-effect transistor, first, a gate electrode is formed on a substrate, and then a gate insulating layer is formed on the gate electrode. In the case where the substrate or gate insulating layer serves as the gate electrode, the gate insulating layer may be directly formed on the substrate without additionally forming the gate electrode. Further, in the method of manufacturing the multi-layered bipolar field-effect transistor, an electron transport layer is formed using an N-type organic semiconductor, and a hole transport layer is formed using a P-type organic semiconductor. An intermediate separating layer is formed between the electron transport layer and hole transport layer. A source electrode and a drain electrode may be formed on the hole transport layer or electron transport layer, may be formed on the gate insulating layer, or may be formed on the intermediate separating layer, depending on the structure of the transistor.

As described above, since the multi-layered bipolar transistor of example embodiments has various structures, the order of the processes may be adjusted depending on the structure thereof.

In the method of manufacturing the multi-layered bipolar field-effect transistor of example embodiments, the intermediate is an insulating oxide layer, and may be formed using $TiO_x$. The thickness of this intermediate separating layer may be within, but is not limited to, the range of about 1 to 1000 nm.

The intermediate separating layer may be formed into a thin film through a solution process, such as spin casting, printing, imprinting, dipping, ink-jetting, roll coating, flow coating, drop casting, spray coating, roll printing, or the like. In example embodiments, since an intermediate separating layer is formed between a hole transport layer and an electron transport layer, when one carrier layer is formed and then the other carrier layer is formed, the previously formed carrier layer is not damaged, and thus the entire device is manufactured through a solution process.

As the organic solvent to be used in the solution process, one or more commonly-used organic solvents may be used. For example, the organic solvent may be one or more selected from the group consisting of: aliphatic hydrocarbon solvents, such as hexane, heptane, and the like; aromatic hydrocarbon solvents, such as toluene, pyridine, quinoline, anisole, mesitylene, xylene, and the like; ketone solvents, such as methyl isobutyl ketone, 1-methyl-2-pyrolidinone, cyclohexanone, acetone, and the like; ether solvents, such as tetrahydrofuran, isopropyl ether, and the like; acetate solvents, such as ethyl acetate, butyl acetate, propylene glycol methyl ether acetate, and the like; alcohol solvents, such as isopropyl alcohol, butyl alcohol, and the like; amide solvents, such as dimethylacetylamide, dimethylformamide, and the like; silicon solvents; and mixtures thereof.

The electron transport layer and hole transport layer may be formed using commonly-used materials. For example, the electron transport layer may be formed using [6,6]-phenyl-$C_{61}$-butyric acid methyl ester (PCBM), and the hole transport layer may be formed using poly(3-hexylthiophene) )("rr-P3HT").

The hole transport layer 30 and electron transport layer 40 may be formed by dissolving a P-type organic semiconductor material and a N-type organic semiconductor material in an organic solvent and then depositing the semiconductor materials on a substrate using a general deposition method, or applying the semiconductor materials on a substrate through a general solution process. If necessary, the hole transport layer 30 and the electron transport layer 40 may be formed into an organic thin film having higher compactness and uniformity by performing an annealing process after the deposition or coating process.

Methods of forming the organic thin film may include, but are not limited to, thermal deposition, vacuum deposition, laser deposition, screen printing, spin casting, printing, imprinting, dipping, ink-jetting, roll coating, flow coating, drop casting, spray coating, roll printing, and the like. The thermal deposition may be performed at a temperature of 80 to 250° C. for 1 minute to 2 hours, but is not limited thereto.

The thickness of the organic thin film may be suitably adjusted depending on the use and purpose thereof in consideration of the kinds of compounds and solvents that are used by those skilled in the art, and particularly, may be in the range of 200 to 10,000 Å.

Hereinafter, example embodiments will be described in more detail with reference to Examples. Here, these Examples are merely set forth to illustrate example embodiments, but should not be construed to be the limit of example embodiments.

REFERENCE EXAMPLE 1

Figure 8A:
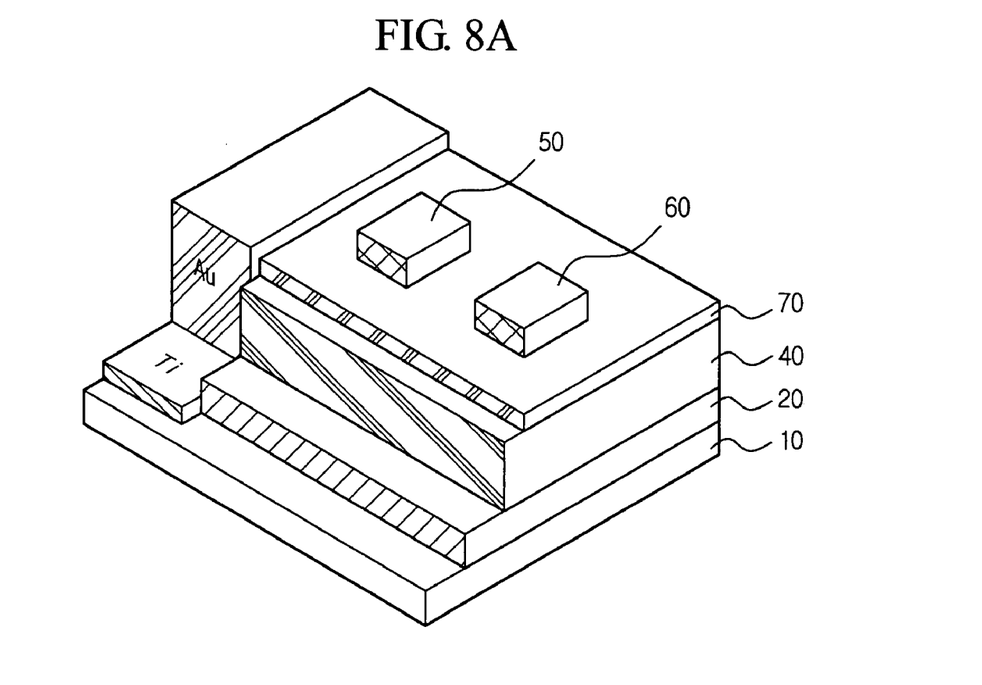
FIG. 8A is a schematic perspective view showing the unipolar field-effect transistor manufactured in Reference EXAMPLE 1.
Figure 8B:
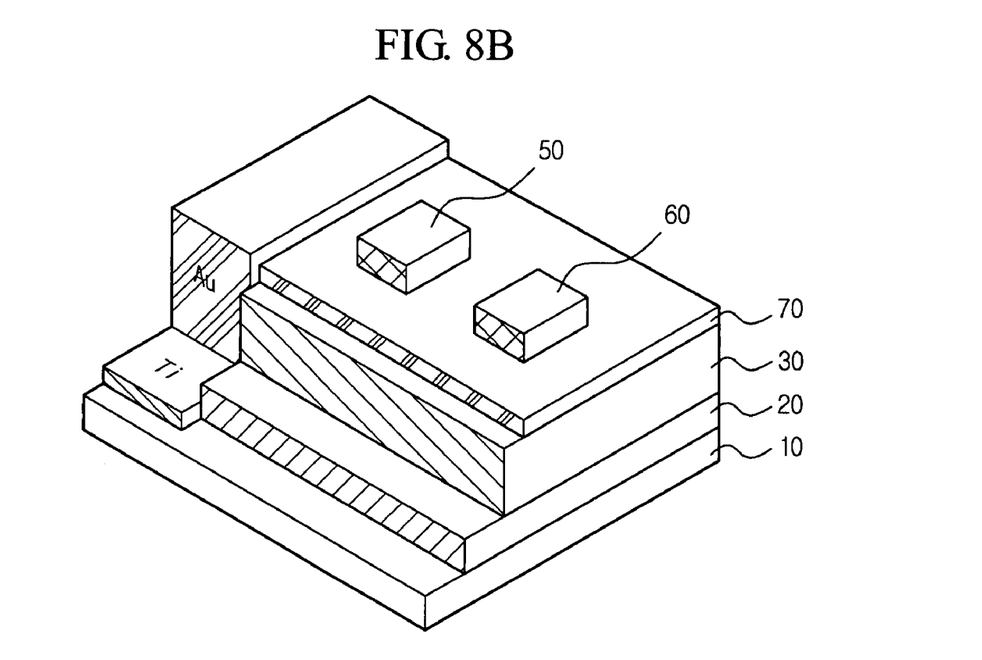
FIG. 8B is a schematic perspective view showing the unipolar field-effect transistor manufactured in Reference Example 2.

In the multi-layered bipolar field-effect transistor of example embodiments, in order to evaluate the function of an intermediate separating layer, as shown in FIGS. 8A and 8B, a unipolar field-effect transistor, in which an intermediate separating layer is applied on a channel layer, was manufactured. First, a $SiO_2$ insulating layer was grown to a thickness of 200 nm on a highly-doped N-type silicon wafer.

A PCBM electron transport layer having a thickness of about 50 nm was formed on the $SiO_2$ insulating layer by spin-coating a mixed solution of PCBM and chlorobenzene of 10 mg/ml in a globe box charged with nitrogen gas at a rotation speed of 250 rpm for 60 seconds. Then, an intermediate separating layer having a thickness of 20 nm was formed on the PCBM electron transport layer by spin-coating a mixed solution of $TiO_x$ and methanol in air at a rotation speed of 5000 rpm for 60 seconds. Subsequently, the formed intermediate separating layer was left at room temperature for 1 hour, and then the precursors were converted into $TiO_x$ through hydrolysis. After the $TiO_x$ was deposited, source and drain electrodes having a thickness of 50 nm were formed on the intermediate separating layer by thermally evaporating aluminum using a shadow mask at a pressure below $10^6$ torr, thereby manufacturing a unipolar FET device, as shown in FIG. 8A. Here, the channel length of the manufactured unipolar FET device was 50 μm, and the channel width thereof was 1500 μm.

Figure 9A:
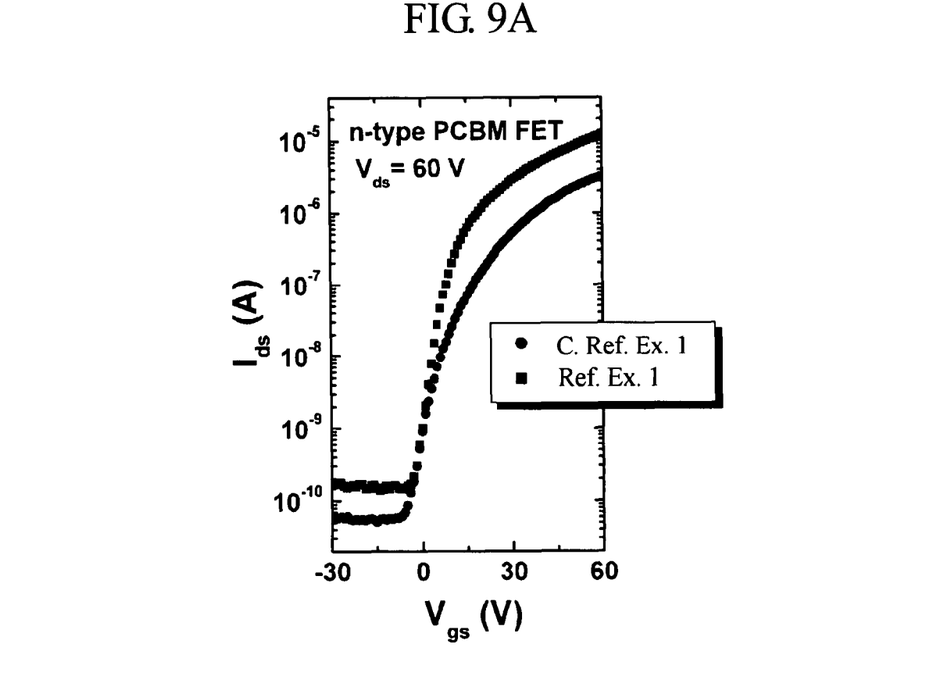
FIG. 9A is a graph showing the transfer characteristics of the transistors manufactured in Reference Example 1 and Comparative Reference Example 1.

After the unipolar FET device was completed, the unipolar FET device was annealed on a hot plate at a temperature of 120° C. for 10 minutes. After the annealing of the unipolar FET device, the unipolar FET device was place on a metal plate and then left at room temperature to be cooled. The electrical properties of the manufactured unipolar FET device were evaluated in a nitrogen atmosphere using a Keithley semiconductor parametric analyzer (Keithley 4200), and the results thereof are shown in FIG. 9A.

REFERENCE EXAMPLE 2

A $SiO_2$ insulating layer was grown to a thickness of 200 nm on a highly-doped P-type silicon wafer. Then, a P3HT hole transport layer having a thickness of about 50 nm was formed on the $SiO_2$ insulating layer by spin-coating a mixed solution of rr-P3HT and chloroform of 2 mg/ml in a globe box charged with nitrogen gas at a rotation speed of 250 rpm for 60 seconds. Then, an intermediate separating layer having a thickness of 20 nm was formed on the P3HT hole transport layer by spin-coating a mixed solution of $TiO_x$ and methanol in air at a rotation speed of 5000 rpm for 60 seconds. Subsequently, the formed intermediate separating layer was left at room temperature for 1 hour, and then the precursors were converted into $TiO_x$ through hydrolysis. After the $TiO_x$ was deposited, source and drain electrodes having a thickness of 50 nm were formed on the intermediate separating layer by thermally evaporating aluminum using a shadow mask at a pressure below $10^6$ torr, thereby manufacturing a unipolar FET device, as shown in FIG. 8B. Here, the channel length of the manufactured unipolar FET device was 50 μm, and the channel width thereof was 1500 μm.

Figure 9B:
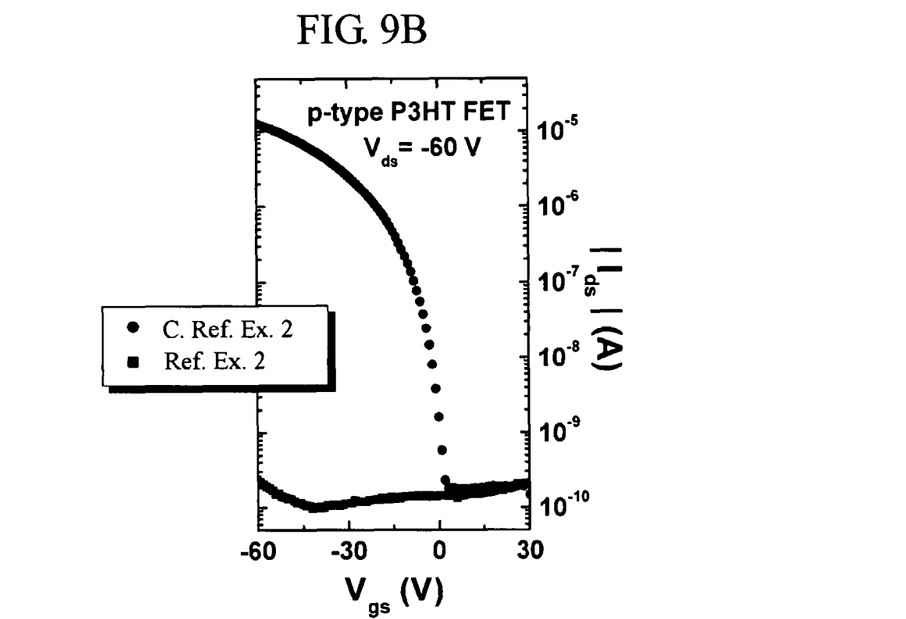
FIG. 9B is a graph showing the transfer characteristics of the transistors manufactured in Reference Example 2 and Comparative Reference Example 2.

After the unipolar FET device was completed, the unipolar FET device was annealed on a hot plate at a temperature of 120° C. for 10 minutes. After the annealing of the unipolar FET device, the unipolar FET device was place on a metal plate and then left at room temperature to be cooled. The electrical properties of the manufactured unipolar FET device were evaluated in a nitrogen atmosphere using a Keithley semiconductor parametric analyzer (Keithley 4200), and the results thereof are shown in FIG. 9B.

COMPARATIVE REFERENCE EXAMPLE 1

The unipolar FET device was manufactured as in Reference Example 1, except that the $TiO_x$ intermediate separating layer was not formed on the PCBM electron transport layer of Reference Example 1, and then the electrical properties of the manufactured unipolar FET device were evaluated using the same method as in Reference Example 1, and the results thereof are shown in FIG. 9A.

COMPARATIVE REFERENCE EXAMPLE 2

The unipolar FET device was manufactured as in Reference Example 2, except that the $TiO_x$ intermediate separating layer was not formed on the P3HT hole transport layer of Reference Example 2, and then the electrical properties of the manufactured unipolar FET device were evaluated using the same method as in Reference Example 2, and the results thereof are shown in FIG. 9B.

The transfer characteristics of the N-type PCBM FET manufactured in Reference Example 1 and the transfer characteristics of the P-type P3HT FET manufactured in Reference Example 2 are shown in FIGS. 9A and 9B, respectively. In the case of the N-type PCBM FET, as shown in FIG. 9A, due to the excellent electron transporting properties of $TiO_x$, the unipolar FET device having a $TiO_x$ intermediate separating layer (Reference Example 1) exhibited much better transfer characteristics than the unipolar FET device having no $TiO_x$ intermediate separating layer (Comparative Reference Example 1). In this case, the $TiO_x$ intermediate separating layer functioned as a buffer layer for the injection of electrons.

Meanwhile, as shown in the energy diagram of FIG. 1B, since the barrier between an aluminum electrode and the highest end of $TiO_x$ in the valence band is high, hole carriers cannot move over the $TiO_x$ intermediate separating layer. Therefore, the flow rate of holes in the P-type P3HT FET having the $TiO_x$ intermediate separating layer (Comparative Reference Example 1), as shown in FIG. 9B, was not increased by the applied gate bias. Accordingly, it was found that the $TiO_x$ intermediate separating layer completely separated the P-channel path and N-channel path in a multi-layered device.

EXAMPLE 1

A $SiO_2$ insulating layer was grown to a thickness of 200 nm on a highly-doped P-type silicon wafer. Then, a P3HT hole transport layer having a thickness of about 50 nm was formed on the $SiO_2$ insulating layer by spin-coating a mixed solution of rr-P3HT and chloroform of 2 mg/ml in a globe box charged with nitrogen gas at a rotation speed of 250 rpm for 60 seconds. Then, an intermediate separating layer having a thickness of 20 nm was formed on the P3HT hole transport layer by spin-coating a mixed solution of $TiO_x$ and methanol in air at a rotation speed of 5000 rpm for 60 seconds. Subsequently, the formed intermediate separating layer was left at room temperature for 1 hour, and then the precursors were converted into $TiO_x$ through hydrolysis.

After the $TiO_x$ intermediate separating layer was deposited, and before rr-P3HT was deposited, source and drain electrodes having a thickness of 50 nm were formed on the $TiO_x$ intermediate separating layer by thermally evaporating aluminum using a shadow mask at a pressure below $10^6$ torr, thereby manufacturing a multi-layered bipolar FET device. Here, the channel length of the manufactured multi-layered bipolar FET device was 50 μm, and the channel width thereof was 1500 μm.

Subsequently, a P3HT hole transport layer having a thickness of about 50 nm was formed by spin-coating a mixed solution of rr-P3HT and chloroform of 2 mg/ml in a globe box charged with nitrogen gas at a rotation speed of 250 rpm for 60 seconds.

After the multi-layered bipolar FET device was completed, the multi-layered bipolar FET device was annealed on a hot plate at a temperature of 120° C. for 10 minutes. After the annealing of the multi-layered bipolar FET device, the multi-layered bipolar FET device was placed on a metal plate and then left at room temperature to be cooled.

EXPERIMENTAL EXAMPLE

Figure 10A:
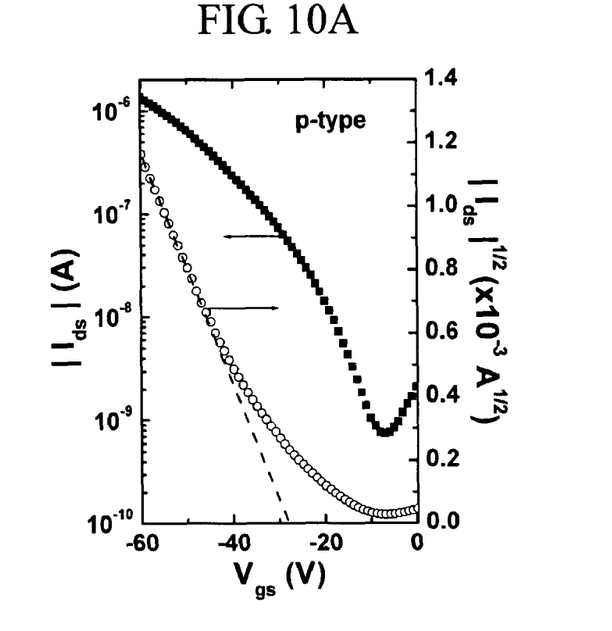
FIG. 10A is a transfer characteristic graph showing the P-type operation of the bipolar field-effect transistor manufactured in Example 1.
Figure 10B:
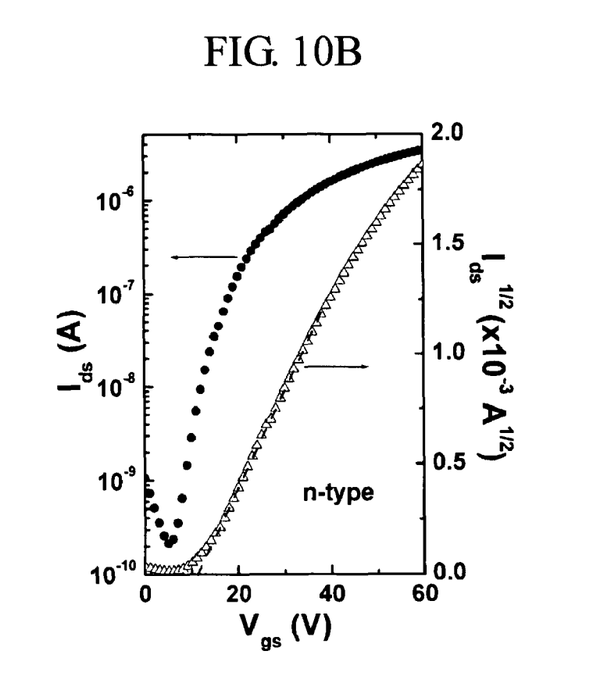
FIG. 10B is a transfer characteristic graph showing the N-type operation of the bipolar field-effect transistor manufactured in Example 1.

The electrical properties of the transistor obtained in Example 1 were evaluated in a nitrogen atmosphere using a Keithley semiconductor parametric analyzer (Keithley 4200), and the results thereof are shown in FIGS. 10A and 10B.

FIGS. 10A and 10B show the transfer characteristics of the hetero-structured multi-layered bipolar FETs having an intermediate separating layer. FIG. 10A shows the experimental results in the case where a negative voltage $V_{ds}$ of −60 V and a negative gate bias was applied, and FIG. 10B shows the experimental results in the case where a positive voltage $V_{ds}$ of 60 V and a positive gate bias was applied. Two curves are shown in the graphs of FIGS. 10A and 10B, respectively. Each of the curves is shown in a different scale on the Y axis, and the results, plotted on the Y axis, are represented by arrows.

In the data obtained from the negative voltage $V_{ds}$ (−60 V) and negative gate bias, as shown in FIG. 10A, P-type operation was performed, and, in the data obtained from the positive voltage $V_{ds}$ (60 V) and positive gate bias, as shown in FIG. 10B, N-type operation was performed. The device manufactured in Example 1 exhibited excellent bipolar behavior, having both P-type characteristics and N-type characteristics. The mobility $\mu_e$ of N-channel calculated from $I_{ds}^{1/2}$ was $8.9 \times 10^{-3}$ $cm^2V^{-1}s^{-1}$, and the mobility $\mu_e$ of P-channel calculated from $I_{ds}^{1/2}$ was $5.7 \times 10^{-3}$ $cm^2V^{-1}s^{-1}$.

In conclusion, it was found that the bipolar effect of the multi-layered organic FET was exhibited using the rr-P3HT and PCBM layers, separated from each other by a $TiO_x$ intermediate separating layer. Since the $TiO_x$ intermediate separating layer prevented the dissolution of a first layer, formed before a second layer was layered thereon, the multi-layered organic FET was first manufactured through a solution process. In the multi-layered bipolar field-effect transistor of example embodiments, since the $TiO_x$ intermediate separating layer greatly serves to accomplish the bipolar characteristics of the transistor by effectively separating a hole transport channel and an electron transport channel, the transistor of example embodiments was found to exhibit excellent electron mobility and hole mobility. Even though non-FET characteristics were remarkably decreased in low gate bias, the hole mobility of the transistor was $8.9 \times 10^{-3}$ $cm^2V^{-1}s^{-1}$ and the electron mobility thereof was $5.7 \times 10^{-3}$ $cm^2V^{-1}s^{-1}$.

According to the multi-layered bipolar field-effect transistor of example embodiments, an intermediate separating layer is formed between an electron transport layer and a hole transport layer, so that a P-channel and a N-channel are effectively separated, with the result that the recombination of electrons and holes is prevented, thereby improving the electrical properties, such as current ON/OFF ratio, electron mobility, hole mobility, and the like. Further, according to the multi-layered bipolar field-effect transistor of example embodiments, during a solution process, a thin film formed in a previous process is not damaged in a subsequent process, so that the entire device can be easily manufactured through a solution process, thereby improving processability. Accordingly, the multi-layered bipolar field-effect transistor of example embodiments can be applied to flexible devices.

Although the preferred embodiments of example embodiments have been disclosed for illustrative purposes, those skilled in the art will appreciate that various modifications, additions and substitutions are possible, without departing from the scope and spirit of the invention as disclosed in the accompanying claims. Example embodiments are not limited to the shape, materials or sizes described in the specification and drawings.

What is claimed is:

1. A multi-layered bipolar field-effect transistor, comprising:
    a gate electrode;
    a gate insulating layer on the gate electrode;
    a multi-layer structure on the gate insulating layer, the multi-layer structure including an electron transport layer, a hole transport layer, and an intermediate separating layer, the intermediate separating layer between the electron transport layer and the hole transport layer, the intermediate separating layer configured to at least substantially block transport of one of holes and electrons between the electron transport layer and the hole transport layer;
a source electrode; and
a drain electrode, the source and drain electrodes connected to the multi-layer structure, the source and drain electrodes separated from one of the electron transport layer and the hole transport layer by the intermediate separating layer.

2. The multi-layered bipolar field-effect transistor according to claim 1, wherein
the electron transport layer is on the gate insulating layer,
the intermediate separating layer is on the electron transport layer, and
the hole transport layer is between the electron transport layer and the source and drain electrodes.

3. The multi-layered bipolar field-effect transistor according to claim 1, wherein
the hole transport layer is on the gate insulating layer,
the intermediate separating layer is on the hole transport layer, and
the electron transport layer is between the hole transport layer and the source and drain electrodes.

4. The multi-layered bipolar field-effect transistor according to claim 1, wherein
the electron transport layer is on the gate insulating layer,
the intermediate separating layer is on the electron transport layer,
the source electrode and the drain electrode are on the intermediate separating layer, and
the hole transport layer is on the intermediate separating layer between the source electrode and the drain electrode.

5. The multi-layered bipolar field-effect transistor according to claim 1, wherein
the hole transport layer is on the gate insulating layer,
the intermediate separating layer is on the hole transport layer,
the source electrode and the drain electrode are on the intermediate separating layer, and
the electron transport layer is on the intermediate separating layer between the source electrode and the drain electrode.

6. The multi-layered bipolar field-effect transistor according to claim 1, wherein
the source electrode and the drain electrode are on the gate insulating layer,
the electron transport layer is on the gate insulating layer between the source and drain electrodes,
the intermediate separating layer is on the electron transport layer, and
the hole transport layer is on the intermediate separating layer.

7. The multi-layered bipolar field-effect transistor according to claim 1, wherein
the source electrode and the drain electrode are on the gate insulating layer,
the hole transport layer is on the gate insulating layer between the source and drain electrodes,
the intermediate separating layer is on the hole transport layer, and
the electron transport layer is on the intermediate separating layer.

8. The multi-layered bipolar field-effect transistor according to claim 1, wherein the intermediate separating layer is an insulating oxide layer.

9. The multi-layered bipolar field-effect transistor according to claim 8, wherein the insulating oxide is $TiO_x$.

10. The multi-layered bipolar field-effect transistor according to claim 1, wherein the intermediate separating layer has a thickness of about 1 to about 1000 nm.

11. The multi-layered bipolar field-effect transistor according to claim 1, wherein the electron transport layer includes at least one of fullerene, derivatives thereof, thiophene derivatives substituted with perfluoroalkyl groups, phthalocyanine derivatives substituted with perfluoroalkyl groups, derivatives including thiazole, thiadiazole, oxazole, isooxazole, oxadiazole, imidazole, pyrazole, triazole and tetrazole, derivatives including pyridine, pyridazine, pyrimidine, pyrazine, and triazine, quinoline, isoquinoline, quinoxaline, naphthyridine, benzoimidazole, pyridopyrimidine, benzothiazole, benzothiadiazole, benzotriazole, benzooxazole, phenanthridine, phenanthroline, phenazine, Poly(p-phenylene-2,6-benzobisthiazole) (PBZT), Poly(benzobisimidazobenzophenanthroline) (BBL), and N,N'-bis[3-[2-[2-(1-butoxy) ethoxy] ethoxy]propyl]perylene-3,4,9,10-tetracarboxyimide (PPEEB).

12. The multi-layered bipolar field-effect transistor according to claim 1, wherein the hole transport layer includes a P-type organic semiconductor material including at least one of porphyrin compound derivatives including N,N'-diphenyl-N,N'-di(3-methylphenyl)-4,4'-diaminobiphenyl, N,N'-diphenyl-N,M-dinaphthyl-4,4'-diaminobiphenyl, and N,N,N',N'-tetraphenyl-21H,23H-porphyrin; triarylamine derivatives including polymers having an aromatic tertiary amine in a main chain or side chains thereof, 1,1-bis(4-di-p-tolylaminophenyl)cyclohexane, N,N,N-tri(p-tolyl)amine, and 4,4',4'-tris[N-(3-methylphenyl)-N-phenylamino]triphenylamine; carbazole derivatives including N-phenylcarbazole and polyvinylcarbazole; phthalocyanine derivatives including metal-free phthalocyanine and copper phthalocyanine; starburst amine derivatives; enaminestilbene derivatives; styryl amine derivatives including aromatic tertiary amine; spirobifluorenyl anthracene; tetrafluorene; pentacene, thiophene, aniline; pyrrole; phenylene vinylene; polythiophene, polythiophenethiazole, polyaniline, polyacetylene, polypyrrole, polyphenylene vinylene, and derivatives thereof, and one of of poly-3-hexyl-thiophene (P3HT), poly[2-methoxy-5-(2'-ethylhexyloxy)-1,4-phenylene vinylene (MEH-PVV), poly(2,5-thienylene vinylene)(PVT), and poly(3',4'-dialkyl-2,2', 5',2-terthiophene.

13. The multi-layered bipolar field-effect transistor according to claim 1, wherein the electron transport layer includes [6,6]-phenyl-$C_{61}$-butyric acid methyl ester, and
the hole transport layer includes poly(3-hexylthiophene).

14. The multi-layered bipolar field-effect transistor according to claim 1, wherein the source electrode and drain electrode include at least one of gold, silver, aluminum, nickel, molybdenum, tungsten, chromium, alloys thereof, metal oxides including indium-tin oxide (ITO) and indium-zinc oxide, and conductive polymers including polythiophene, polyaniline, polyacetylene, polypyrrole, polyphenylene vinylene, and a PEDOT (polyethylenedioxythiophene)/PSS (polystyrenesulfonate) mixture.

15. An electronic device comprising the multi-layered bipolar field-effect transistor according to claim 1.

16. The electronic device comprising the multi-layered bipolar field-effect transistor according to claim 15, wherein the electronic device is an organic light emitting device, an organic photoelectric device, an active matrix display device, an inverter, or a complimentary circuit.

17. A method of manufacturing a multi-layered bipolar field-effect transistor, comprising:
forming a gate electrode;
forming a gate insulating layer on the gate electrode;
forming a multi-layered structure on the gate insulating layer, the forming of the multi-layered structure including forming an electron transport layer, a hole transport layer, and an intermediate separating layer, the intermediate separating layer formed between the electron transport layer and the hole transport layer, the intermediate separating layer formed to at least substantially block transport of one of holes and electrons between the electron transport layer and the hole transport layer; and
forming source and drain electrodes connected to the multi-layered structure such that the source and drain electrodes are separated from one of the electron transport layer and the hole transport layer by the intermediate separating layer.

18. The method of manufacturing a multi-layered bipolar field-effect transistor according to claim 17, wherein
the forming of the multi-layer structure includes forming the electron transport layer to include an N-type organic semiconductor and the hole transport layer to include a P-type organic semiconductor.

19. The method of manufacturing a multi-layered bipolar field-effect transistor according to claim 17, wherein the forming of the multi-layer structure includes forming the intermediate separating layer to include an insulating oxide layer.

20. The method of manufacturing a multi-layered bipolar field-effect transistor according to claim 19, wherein the forming of the multi-layer structure includes forming the intermediate separating layer to include $TiO_x$.

21. The method of manufacturing a multi-layered bipolar field-effect transistor according to claim 17, wherein the forming of the multi-layer structure includes forming the intermediate separating layer to a thickness of about 1 to about 1000 nm.

22. The method of manufacturing a multi-layered bipolar field-effect transistor according to claim 17, wherein the forming of the multi-layer structure includes forming the electron transport layer to include at least one fullerene, derivatives thereof, thiophene derivatives substituted with perfluoroalkyl groups, phthalocyanine derivatives substituted with perfluoroalkyl groups, derivatives including thiazole, thiadiazole, oxazole, isooxazole, oxadiazole, imidazole, pyrazole, triazole and tetrazole, derivatives including pyridine, pyridazine, pyrimidine, pyrazine, and triazine, quinoline, isoquinoline, quinoxaline, naphthyridine, benzoimidazole, pyridopyrimidine, benzothiazole, benzothiadiazole, benzotriazole, benzooxazole, phenanthridine, phenanthroline, phenazine, Poly(p-phenylene-2,6-benzobisthiazole) (PBZT), Poly(benzobisimidazobenzophenanthroline) (BBL), and N,N'-bis[3-[2-[2-(1-butoxy)ethoxy]ethoxy]propyl]perylene-3,4,9,10-tetracarboxyimide (PPEEB).

23. The method of manufacturing a multi-layered bipolar field-effect transistor according to claim 17, wherein the forming of the multi-layer structure includes forming the hole transport layer to include a P-type organic semiconductor material including at least one of porphyrin compound derivatives including N,N'-diphenyl-N,N'-di(3-methylphenyl)-4,4'-diaminobiphenyl, N,N'-diphenyl-N,N'-dinaphthyl-4,4'-diaminobiphenyl, and N,N,N',N'-tetraphenyl-21H, 23H-porphyrin; triarylamine derivatives including polymers having an aromatic tertiary amine in a main chain or side chains thereof, 1,1-bis(4-di-p-tolylaminophenyl) cyclohexane, N,N,N-trip-tolyl)amine, and 4,4',4'-tris [N-(3-methylphenyl)-N-phenylamino]triphenylamine; carbazole derivatives including N-phenylcarbazole and polyvinylcarbazole; phthalocyanine derivatives including metal-free phthalocyanine and copper phthalocyanine; starburst amine derivatives; enaminestilbene derivatives; styryl amine derivatives including aromatic tertiary amine; spirobifluorenyl anthracene; tetrafluorene; pentacene, thiophene, aniline; pyrrole; phenylene vinylene; polythiophene, polythiophene-thiazole, polyaniline, polyacetylene, polypyrrole, polyphenylene vinylene, and derivatives thereof, and one of poly-3-hexyl-thiophene (P3HT), poly[2-methoxy-5-(2'-ethyl-hexyloxy)-1,4-phenylene vinylene (MEH-PVV), poly(2,5-thienylene vinylene) (PVT), and poly(3',4'-dialkyl-2,2',5',2"-terthiophene.

24. The method of manufacturing a multi-layered bipolar field-effect transistor according to claim 17, wherein the forming of the multi-layer structure includes forming the electron transport layer to include [6,6]-phenyl-$C_{61}$-butyric acid methyl ester and the hole transport layer to include poly(3-hexylthiophene).

25. The method of manufacturing a multi-layered bipolar field-effect transistor according to claim 17, wherein the forming of the source electrode and drain electrode includes forming the source and drain electrodes to include at least one of gold, silver, aluminum, nickel, molybdenum, tungsten, chromium, alloys thereof, metal oxides including indium-tin oxide (ITO) and indium-zinc oxide, and conductive polymers including polythiophene, polyaniline, polyacetylene, polypyrrole, polyphenylene vinylene, and PEDOT (polyethylenedioxythiophene)/PSS(polystyrenesulfonate) mixture.

* * * * *

UNITED STATES PATENT AND TRADEMARK OFFICE
CERTIFICATE OF CORRECTION

PATENT NO. : 7,935,961 B2
APPLICATION NO. : 11/976090
DATED : May 3, 2011
INVENTOR(S) : Sang Yoon Lee et al.

It is certified that error appears in the above-identified patent and that said Letters Patent is hereby corrected as shown below:

Title Page, item 73, Assignee, should read:

Samsung Electronics Co., Ltd., Gyeonngi-do (KR)

The Regents of the University of California, 1111 Franklin St., 6th Floor Oakland, California 94607-6200

Signed and Sealed this
Thirty-first Day of January, 2012

David J. Kappos
*Director of the United States Patent and Trademark Office*